United States Patent
Mabuchi

(10) Patent No.: US 9,531,972 B2
(45) Date of Patent: Dec. 27, 2016

(54) SOLID-STATE IMAGING DEVICE, METHOD FOR DRIVING THE SAME, AND IMAGING DEVICE

(71) Applicant: Sony Corporation, Tokyo (JP)

(72) Inventor: Keiji Mabuchi, Kanagawa (JP)

(73) Assignee: Sony Semiconductor Solution Corporation, Kanagawa (JP)

( * ) Notice: Subject to any disclaimer, the term of this patent is extended or adjusted under 35 U.S.C. 154(b) by 0 days.

(21) Appl. No.: 14/593,702

(22) Filed: Jan. 9, 2015

(65) Prior Publication Data

US 2015/0124141 A1 May 7, 2015

Related U.S. Application Data

(63) Continuation of application No. 13/588,627, filed on Aug. 17, 2012, now Pat. No. 8,964,077, which is a continuation of application No. 12/517,595, filed as application No. PCT/JP2007/072389 on Nov. 19, 2007, now Pat. No. 8,274,588.

(30) Foreign Application Priority Data

Dec. 7, 2006 (JP) .................. 2006-330295

(51) Int. Cl.
| | |
|---|---|
| H04N 5/355 | (2011.01) |
| H04N 5/359 | (2011.01) |
| H04N 5/378 | (2011.01) |
| H04N 5/374 | (2011.01) |
| H01L 27/146 | (2006.01) |
| H04N 5/345 | (2011.01) |
| H04N 5/353 | (2011.01) |

(52) U.S. Cl.
CPC ........ *H04N 5/374* (2013.01); *H01L 27/14654* (2013.01); *H04N 5/3452* (2013.01); *H04N 5/3535* (2013.01); *H04N 5/3591* (2013.01); *H04N 5/35581* (2013.01); *H04N 5/378* (2013.01)

(58) Field of Classification Search
CPC ...... H04N 5/3535; H04N 5/374; H04N 5/378; H04N 5/3452; H04N 5/3591; H04N 5/35581; H01L 27/14654
See application file for complete search history.

(56) References Cited

U.S. PATENT DOCUMENTS

| | | | |
|---|---|---|---|
| 6,859,231 B1 * | 2/2005 | Sumi et al. ................ 348/302 |
| 2005/0151866 A1 * | 7/2005 | Ando .................. H04N 5/2355 348/297 |
| 2005/0168589 A1 * | 8/2005 | Silverstein et al. ....... 348/220.1 |
| 2006/0017829 A1 * | 1/2006 | Gallagher ............. H04N 9/045 348/276 |
| 2007/0052811 A1 * | 3/2007 | Suzuki ................ H04N 3/1562 348/222.1 |
| 2009/0051794 A1 * | 2/2009 | Ando ........................ 348/274 |

* cited by examiner

*Primary Examiner* — Mekonnen Dagnew
(74) *Attorney, Agent, or Firm* — Sheridan Ross P.C.

(57) ABSTRACT a CMOS image sensor including a pixel array unit having pixels arranged in even-numbered pixel rows and odd-numbered pixel rows. A reading operation performed such that a first signal of a first pixel group is read in a first accumulation time, and a second signal of a second pixel group is read in a second accumulation time shorter than said first accumulation time.

20 Claims, 6 Drawing Sheets

SOLID-STATE IMAGING DEVICE, METHOD FOR DRIVING THE SAME, AND IMAGING DEVICE This application is a continuation of U.S. patent application Ser. No. 13/588,627, filed Aug. 17, 2012, which is a continuation of U.S. patent application Ser. No. 12/517,595, filed Jun. 4, 2009, now U.S. Pat. No. 8,274,588, which is a Section 371 National Stage of PCT/JP2007/072389, filed Nov. 19, 2007, which claims priority to Japanese Patent Application No. 2006-330295, filed in the Japan Patent Office on Dec. 7, 2006, the entire disclosures of which are hereby incorporated herein by reference.

BACKGROUND

The present invention relates to solid-state imaging devices, methods for driving solid-state imaging devices, and imaging devices, and particularly relates to a solid-state imaging device employing a technique of wide dynamic range, a method for driving the solid-state imaging device, and an imaging device employing the solid-state imaging device.

SUMMARY

In solid-state imaging devices such as MOS (Metal Oxide Semiconductor) imaging devices, for example, a technique of differentiating accumulation times (exposure times) of individual pixels included in a pixel array unit in which pixels including photoelectric conversion elements are two-dimensionally arranged in a matrix, obtaining high-sensitive signals and low-sensitive signals in accordance with lengths of the accumulation times, and combining the high-sensitive signals and the low-sensitive signals so that a wide dynamic range is attained has been widely known.

As a technique for attaining the wide dynamic range, a technique of performing electronic shutter operations with shutter speeds different between even-pixel rows and odd-pixel rows, setting accumulation times different between the even-pixel rows and the odd-pixel rows so that signals having different sensitivities are obtained, and combining the signals having the different sensitivities using a signal processing system in a later stage has been proposed (refer to Japanese Unexamined Patent Application Publication 2006-253876, for example).

DISCLOSURE OF INVENTION

In the related art disclosed in Japanese Unexamined Patent Application Publication No. 2006-253876, the sensitivities should be proportional to the accumulation times. However, in fact, the sensitivities may be shifted from proportional values by more than ranges of errors. This occurs due to a reason described below. That is, when a photoelectric conversion element of a certain pixel is saturated, an optical charge which is further generated overflows from the photoelectric conversion element and part of the optical charge intrudes into a photoelectric conversion element in an adjacent pixel. Accordingly, a signal having a sensitivity in proportion to an accumulation time is not obtained in the adjacent pixel.

The phenomenon described above in which part of an optical charge which overflows from a photoelectric conversion element of a certain pixel intrudes into a photoelectric conversion element of an adjacent pixel is referred to as blooming. In the case of the related art described above, since pixels having a long accumulation time and pixels having a short accumulation time are arranged in the even pixel rows and the odd pixel rows so as to be adjacent to each other, optical charges overflow from photoelectric conversion elements of the pixels having a long accumulation time which are likely to be saturated, and the overflowing optical charges intrude into photoelectric conversion elements of the pixels having a short accumulation time, and accordingly, amounts of signals of the pixels having a short accumulation time increase. Consequently, in the pixels having a short accumulation time, sensitivities are not proportional to the accumulation times, and therefore, accuracy of signal processing for attaining a wide dynamic range is degraded.

Accordingly, an object of the present invention is to provide a solid-state imaging device capable of eliminating adverse effects to low-sensitive signals due to blooming when a wide dynamic range method in which different accumulation times are employed between adjacent pixels is used, a method for driving the solid-state imaging device, and an imaging device.

In order to attain the object, according to the present invention, in a solid-state imaging device having a pixel array unit in which pixels which detect physical quantities are two-dimensionally arranged in a matrix and an imaging device employing the solid-state imaging device, physical quantities, which have been accumulated in a first accumulation time (exposure time), of pixels in a first pixel group among the pixels included in the pixel array unit are read, and physical quantities, which have been accumulated in a second accumulation time which is shorter than the first accumulation time, of pixels of a second pixel group which are arranged adjacent to the pixels of the first pixel group, among the pixels included in the pixel array unit are read in a beginning portion of the first accumulation time.

In the solid-state imaging device having the configuration described above and the imaging device, since the reading operation performed on the pixels of the second pixel group having a short accumulation time is performed in the beginning portion of the first accumulation time, that is, in an exposure start portion of the pixels of the first pixel group which have a long accumulation time and which are likely to be saturated, even when the pixels of the first pixel group are saturated and the physical quantities overflow from the pixels, and therefore, part of the physical quantities intrude into the pixels of the second pixel group which are arranged adjacent to the pixels of the first pixel group, signals output from the pixels of the second pixel group are not influenced by the physical quantities which have overflowed from the pixels of the first pixel group since the reading operation performed on the pixels of the second pixel group has been completed.

BEST MODE FOR CARRYING OUT THE INVENTION

An embodiment of the present invention will be described hereinafter with reference to the accompanying drawings.

Figure 1:
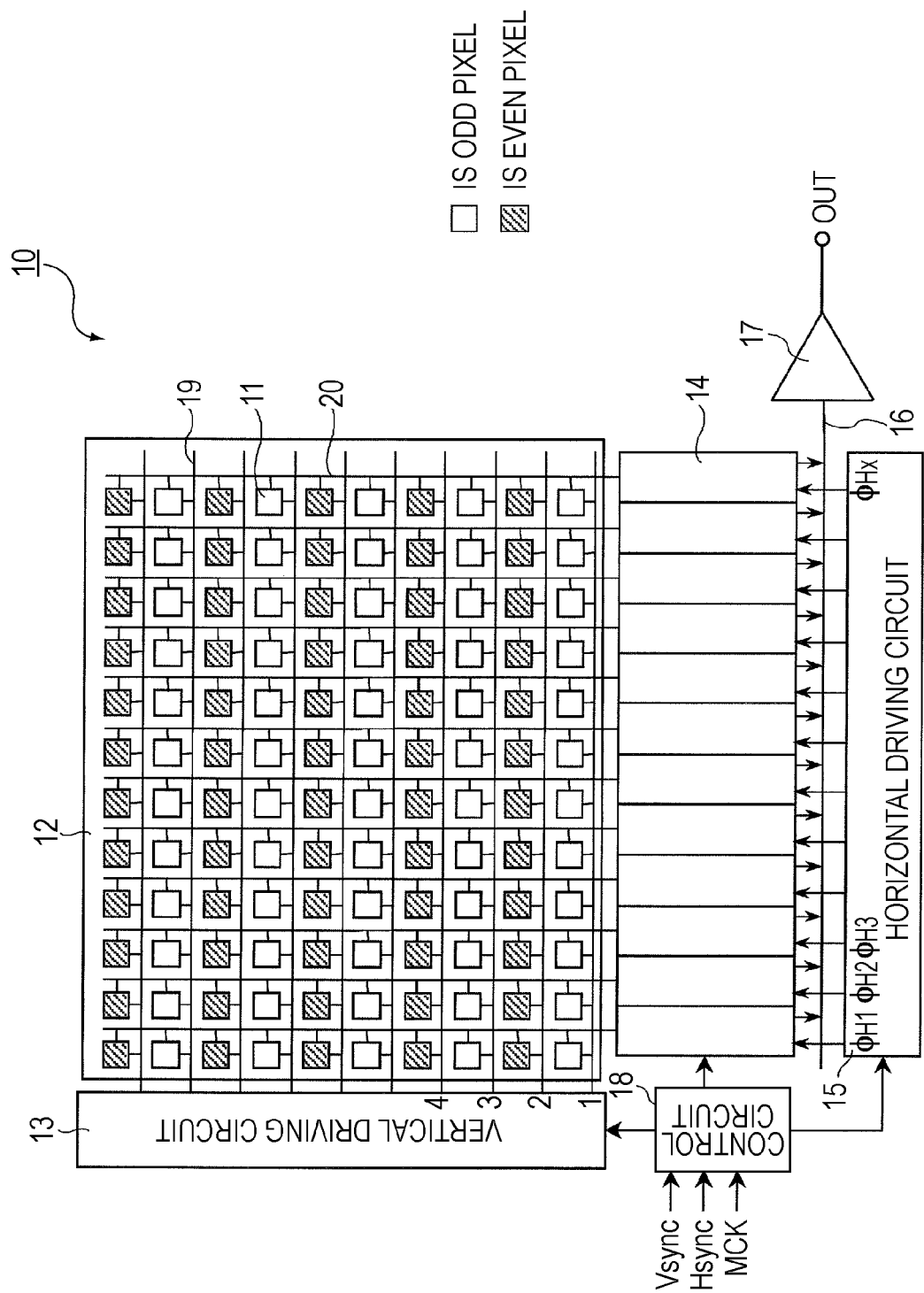
FIG. 1 is a diagram schematically illustrating a system configuration of a CMOS image sensor according to an embodiment of the present invention.

FIG. 1 is a diagram schematically illustrating a system configuration of a solid-state imaging device according to the embodiment of the present invention. In this embodiment, a CMOS image sensor, for example, which detects, as a physical quantity, a charge amount in accordance with a quantity of visible light in a unit of pixel is taken as an example of the solid-state imaging device.

(Configuration of CMOS Image Sensor)

As shown in FIG. 1, a CMOS image sensor 10 of this embodiment has a pixel array unit 12 in which unit pixels (unit sensors) 11 including photoelectric conversion elements which photoelectrically convert incoming visible light beams into charge amounts in accordance with quantities of the light beams are two-dimensionally arranged in a matrix (a form of a matrix).

In addition to the pixel array unit 12, the CMOS image sensor 10 includes in its system configuration a vertical driving circuit 13, column signal processing circuits 14, a horizontal driving circuit 15, a horizontal signal line 16, an output circuit 17, and a control circuit 18, which serve as driving means for driving the pixels included in the pixel array unit 12, signal processing means for processing signals output from the respective pixels, or controlling means for controlling the system.

In this system configuration, the control circuit 18 externally receives data used to instruct an operation mode, for example, of the CMOS image sensor 10, and externally outputs data including information on the CMOS image sensor 10.

Furthermore, the control circuit 18 generates clock signals and control signals, for example, serving as references for operations performed by circuits such as the vertical driving circuit 13, the column signal processing circuits 14, and the horizontal driving circuit 15, for example, in accordance with a vertical synchronization signal Vsync, a horizontal synchronization signal Hsync, and a master clock MCK. The clock signals and the control signals, for example, generated by the control circuit 18 are supplied to the vertical driving circuit 13, the column signal processing circuits 14, and the horizontal driving circuit 15, for example.

In the pixel array unit 12, the unit pixels (hereinafter simply referred to as "pixels" in some cases) 11 are two-dimensionally arranged in a matrix. As shown in FIG. 1, the unit pixels 11 are arranged substantially in a square grid. This means that optical apertures defined by the photoelectric conversion elements and metal lines, for example, are arranged substantially in a square grid. However, circuit portions of the unit pixels 11 are exceptions. That is, the circuit portions, which will be described hereinafter, of the unit pixels 11 are not required to be arranged substantially in a square grid.

Furthermore, in the pixel array unit 12, pixel driving lines 19 are formed in a lateral direction of the drawing (a direction of arrangement of the pixels in pixel rows) for individual pixel rows in the arrangement of the matrix of the unit pixels 11, and vertical signal lines 20 are formed in a vertical direction of the drawing (an direction of arrangement of the pixels in pixel columns) for individual pixel columns. First ends of the pixel driving lines 19 are connected to output terminals of the vertical driving circuit 13 corresponding to the pixel rows.

The vertical driving circuit 13 is constituted by a shift register and an address decoder, for example, performs selection scanning successively on the unit pixels 11 of the pixel array unit 12 for individual rows, and supplies required driving pulses (control pulses) to individual pixels in a selected one of the rows through the pixel driving lines 19.

Here, assuming that, as shown in FIG. 1, in the pixel arrangement of the pixel array unit 12, pixels arranged in pixel rows to which odd numbers such as 1, 3, and so on counted from the bottom are assigned and which are driven by the vertical driving circuit 13 through the pixel driving lines 19 are referred to as odd pixels whereas pixels arranged in pixel rows to which even numbers such as 2, 4, and so on are assigned and which are driven by the vertical driving circuit 13 through the pixel driving lines 19 are referred to as even pixels, the odd pixels and the even pixels are arranged as shown in the drawing.

Although a configuration of the vertical driving circuit 13 is not shown in detail, the vertical driving circuit 13 includes in its configuration a read-scanning system for performing the selection scanning successively on the unit pixels 11 which read signals for individual rows, and a sweep-scanning system for performing sweep scanning in which unnecessary charges are swept out (reset) from the photoelectric conversion elements of the unit pixels 11 in the rows which are subjected to read scanning by the read-scanning system during a period of time corresponding to a shutter speed before the read scanning is started.

A so-called electronic shutter operation is performed by sweeping out (resetting) the unnecessary charges by the sweep-scanning system. Hereinafter, the sweep-scanning system is referred to as an electronic-shutter scanning system. Note that the electronic shutter operation means an operation of discharging optical charges of the photoelectric conversion elements and newly starting exposure (starting accumulation of optical charges).

A signal read in a reading operation performed by the read-scanning system corresponds to a quantity of a light beam which is incident on after a preceding reading operation or a preceding electronic shutter operation is performed. Then, a period of time from a reading timing in the preceding reading operation or a sweeping timing in the electronic shutter operation to a reading timing in a current reading operation corresponds to an accumulation time (exposure time) of an optical charge of one of the unit pixels 11.

Signals output from unit pixels 11 in a selected one of the rows are supplied to the column signal processing circuits 14 through the vertical signal lines 20 arranged for individual pixel columns. The column signal processing circuits 14 are arranged for individual pixel columns of the pixel array unit 12, for example, that is, arranged so as to have the one-to-one relationships with the corresponding pixel columns.

The column signal processing circuits 14 receive signals individually output from the unit pixels 11 of the selected row for individual pixel columns of the pixel array unit 12, and perform signal processing such as CDS (Correlated Double Sampling) or signal amplification on the signals so as to remove fixed pattern noise which is unique to each of the pixels.

Note that, here, although a case where a configuration in which the column signal processing circuits 14 are arranged so as to have one-to-one relationships with the pixel columns is employed is taken as an example, the configuration is not limited to this. For example, a configuration in which a single column signal processing circuit 14 is arranged for a plurality of pixel columns (the vertical signal lines 20) so that the column signal processing circuit 14 is shared in a time-sharing manner among the plurality of pixel columns may be employed.

Horizontal selection switches (not shown) are connected between output stages of the column signal processing circuits 14 and the horizontal signal line 16. Note that a configuration in which each of the column signal processing circuits 14 has an A/D (analog/digital) conversion function, in addition to the functions of the CDS and the signal amplification, for example, so as to allow a pixel signal which has been subjected to the signal processing such as the CDS or the signal amplification to be output as a digital signal may be employed.

The horizontal driving circuit 15 is constituted by a sift register and an address decoder, for example, and successively outputs horizontal scanning pulses φH1 to φHx (x denotes the number of pixels in a horizontal direction) to thereby successively select the column signal processing circuits 14. The horizontal scanning pulses φH1 to φHx successively turn on the horizontal selection switches arranged in the output stages of the column signal processing circuits 14.

By successively turning on the horizontal selection switches in response to the horizontal scanning pulses φH1 to φHx, the pixel signals which have been processed for individual pixel columns by the column signal processing circuits 14 are successively supplied to the horizontal signal line 16.

The output circuit 17 performs various signal processing operations on the pixel signals which are successively supplied from the individual column signal processing circuits 14 through the horizontal signal line 16 and outputs the pixel signals. As a detailed signal processing performed by the output circuit 17, for example, only buffering may be performed, or black-level control, variation correction for individual columns, signal amplification, color processing, and the like may be performed before the buffering.

(Circuit Configuration of Unit Pixel)

Figure 2:
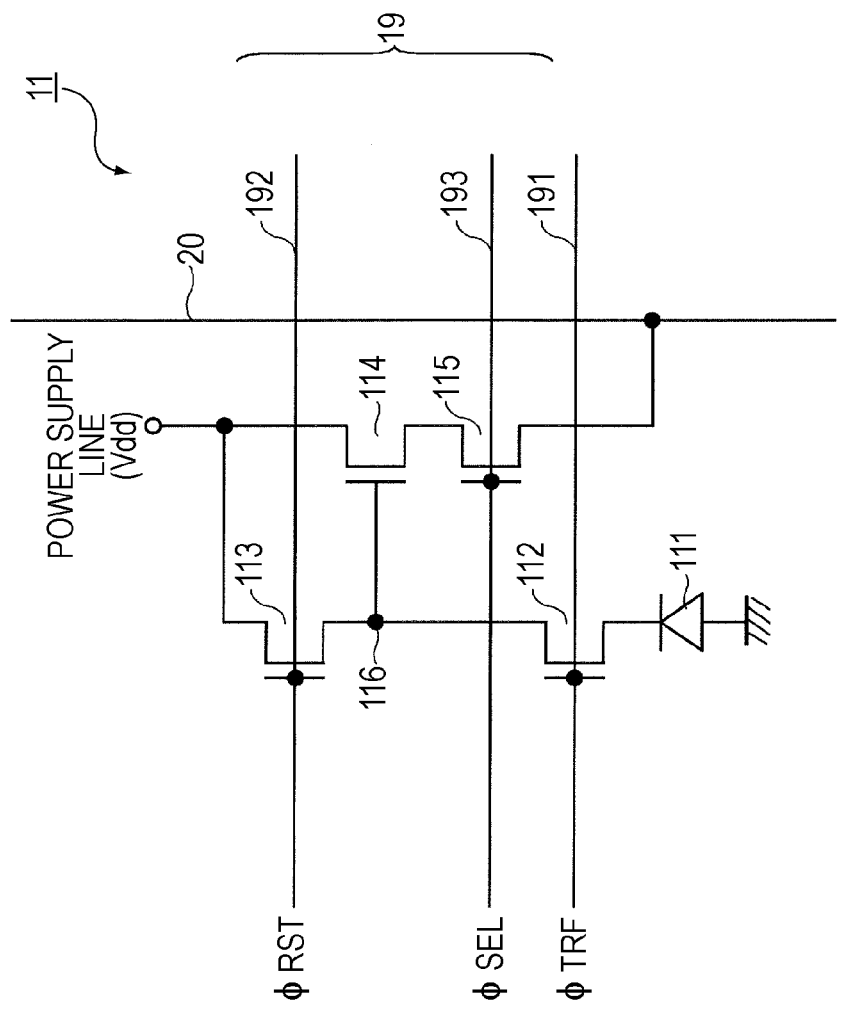
FIG. 2 is a circuit diagram illustrating an example of a circuit configuration of a unit pixel.

FIG. 2 is a circuit diagram illustrating an example of a circuit configuration of one of the unit pixels 11. As shown in FIG. 2, each of the unit pixels 11 according to this circuit example is configured as a pixel circuit including, in addition to a photoelectric conversion element such as a photodiode 111, four transistors, i.e., a transfer transistor 112, a resetting transistor 113, an amplification transistor 114, and a selection transistor 115.

Here, N-channel MOS transistors are used as the transistors 112 to 115, for example. Note that a combination of conductivity types of the transfer transistor 112, the resetting transistor 113, the amplification transistor 114, and the selection transistor 115 is merely an example, and is not limited to the combination of these.

As the pixel driving lines 19, three driving lines, i.e., a transfer line 191, a resetting line 192, and a selection line 193 are arranged in common for unit pixels 11 in an identical pixel row. First ends of the transfer line 191, the resetting line 192, and the selection line 193 are connected to, for each pixel row, output terminals of the vertical driving circuit 13 which correspond to the pixel row.

An anode of the photodiode 111 is connected to a negative side of a power source such as the ground, and the photodiode 111 performs photoelectric conversion on received light so as to obtain an optical charge (photoelectron, herein) in accordance with a quantity (physical quantity) of the light. A cathode of the photodiode 111 is electrically connected to a gate of the amplification transistor 114 through the transfer transistor 112. A node 116 which is electrically connected to the gate of the amplification transistor 114 is referred to as an FD (floating diffusion) section.

The transfer transistor 112 is connected between the cathode of the photodiode 111 and the FD section 116, and is turned on when an active transfer pulse φTRF of a high level (for example, a Vdd level) (hereinafter referred to as "High active") is applied to the gate through the transfer line 191 so as to transfer the optical charge obtained through the photoelectric conversion performed by the photodiode 111 to the FD section 116.

A drain of the resetting transistor 113 is connected to a pixel power source Vdd and a source of the resetting transistor 113 is connected to the FD section 116. The resetting transistor 113 is turned on when a resetting pulse φRST of High active is applied to a gate through the resetting line 192, and resets the FD section 116 by discharging a charge of the FD section 116 to the pixel power source Vdd before the photodiode 111 transfers a signal charge to the FD section 116.

A gate of the amplification transistor 114 is connected to the FD section 116, and a drain of the amplification transistor 114 is connected to the pixel power source Vdd. The amplification transistor 114 outputs a potential of the FD section 116 which has been reset by the resetting transistor 113 as a resetting level, and further outputs a potential of the FD section 116 after the signal charge is transferred by the transfer transistor 112 as a signal level.

A drain of the selection transistor 115 is connected, for example, to a source of the amplification transistor 114 and a source of the selection transistor 115 is connected to a corresponding one of the vertical signal lines 20. The selection transistor 115 is turned on when a selection pulse φSEL of High active is applied to a gate through the selection line 193, and relays a signal output from the amplification transistor 114 in a state in which the unit pixel 11 is being selected to the corresponding one of the vertical signal lines 20.

Note that a circuit configuration in which the selection transistor 115 is connected between the pixel power source Vdd and the drain of the amplification transistor 114 may be employed.

Furthermore, each of the unit pixels 11 is not limited to a unit pixel having four transistors as the described configuration, and a unit pixel having three transistors in which the amplification transistor 114 and the selection transistor 115 are integrated may be employed. Circuit configurations of the unit pixels 11 are not particularly specified.

(Characteristics of this Embodiment)

In the CMOS image sensor 10 having the foregoing configuration, in order to attain a wide dynamic range, this embodiment is characterized by a method for differentiating between an accumulation time for pixels to which high-sensitive signals are supplied and an accumulation time for pixels to which low-sensitive signals are supplied and reading timings of the pixels provided that the high sensitive signals and the low-sensitive signals are to be supplied in accordance with length of the accumulation times.

Note that, in the CMOS image sensor 10 according to this embodiment, the unit pixels 11 included in the pixel array unit 12 are categorized into pixels to which the high-sensitive signals are to be supplied and pixels to which the low-sensitive signals are to be supplied for individual pixel rows. For example, pixels (even pixels) in even-numbered pixel rows are determined as pixels in a first pixel group to which the high-sensitive signals are to be supplied, and pixels (odd pixels) in odd-numbered pixel rows are determined as pixels in a second pixel group to which the low-sensitive signals are to be supplied.

In the related art disclosed in Japanese Unexamined Patent Application Publication No. 2006-253876 described above, by performing electronic shutter operations with shutter speeds different between the even-pixel rows and the odd-pixel rows, accumulation times different between the even-pixel rows and the odd-pixel rows are set, and in addition, by performing operations of reading the low-sensitive signals in a later stages of the accumulation time of the pixels to which the high-sensitive signals are to be supplied, the high-sensitive signals and the low-sensitive signals are obtained.

On the other hand, this embodiment is characterized in that read scanning on the pixels to which the high-sensitive signals are to be supplied and read scanning on the pixels to which the low-sensitive signals are to be supplied are separately performed, and the accumulation time of the pixels to which the high-sensitive signals are to be supplied and the accumulation time of the pixels to which the low-sensitive signals are to be supplied are differentiated from each other in accordance with timings of the reading of the pixels to which the high-sensitive signals are to be supplied and timings of the reading of the pixels to which the low-sensitive signals are to be supplied, instead of in accordance with scanning timings of electronic shutter scanning.

Figure 3:
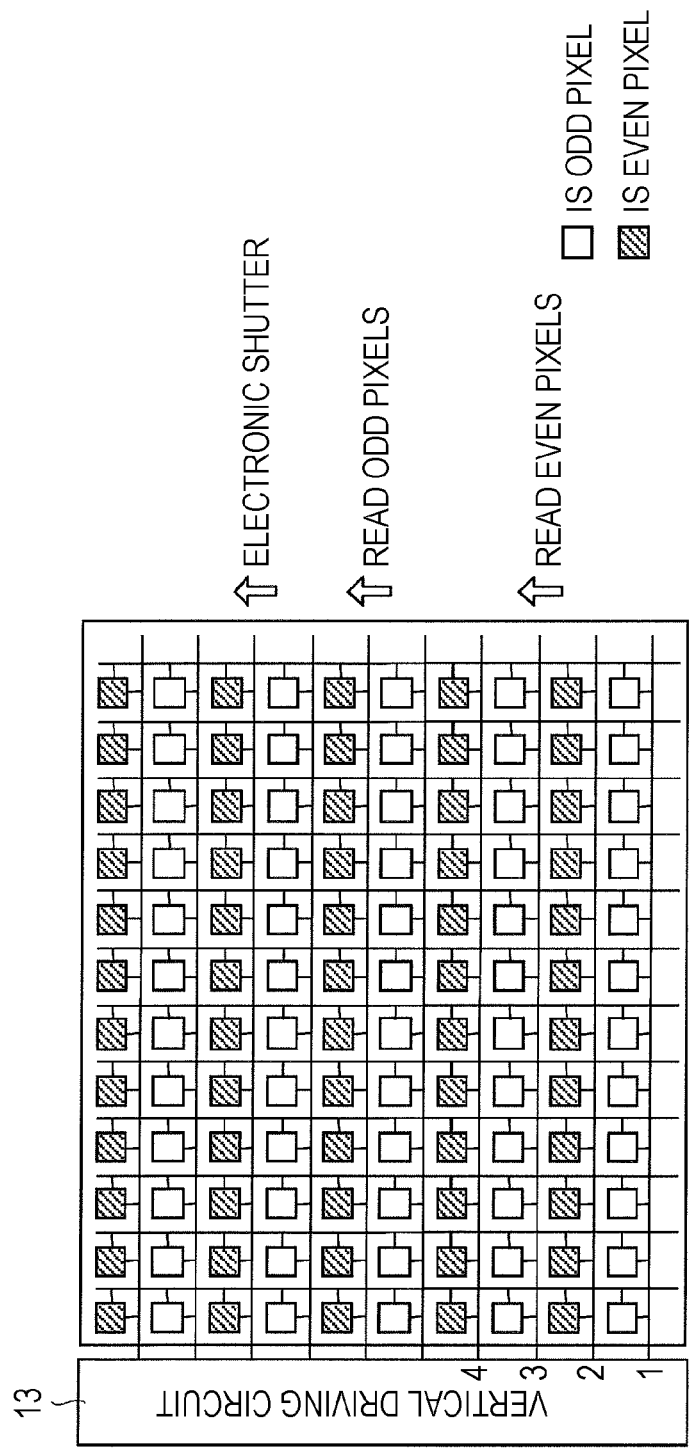
FIG. 3 is a diagram illustrating the relationships between electronic shutter scanning and scanning operations, i.e., odd-pixel reading and even-pixel reading.

More specifically, in the CMOS image sensor 10 according to this embodiment, as shown in FIG. 3, the electronic shutter scanning is performed successively on the individual pixel rows before the read scanning is performed, and thereafter, read scanning is separately performed on the odd-pixel rows and the even-pixel rows (odd-pixel reading/even-pixel reading) whereby the accumulation time of the odd-pixel rows and the accumulation time of the even-pixel rows are differentiated from each other.

Note that the electronic shutter scanning and the read scanning are realized by configurations described below. As described above, the vertical driving circuit 13 includes the read-scanning system and the electronic-shutter scanning system (sweep-scanning system) in its configuration.

In this vertical driving circuit 13, the electronic-shutter scanning system serving as electronic shutter driving means is constituted by the shift register, for example. The shift register successively outputs electronic shutter pulses from a first row on a row-by-row basis whereby a so-called rolling shutter operation (or a focal plane shutter operation) in which shutter scanning is successively performed from the first row is performed.

On the other hand, the read-scanning system is constituted by two shift registers, i.e., a shift register for even-row scanning and a shift register for odd-row scanning, and alternately outputs even-row reading pulses and odd-row reading pulses from the corresponding shift registers whereby the different pixel rows, specifically, the even-pixel rows and the odd-pixel rows which are adjacent to each other are alternately subjected to a reading operation. Here, the two shift registers correspond to first driving means and second driving means.

Figure 5:
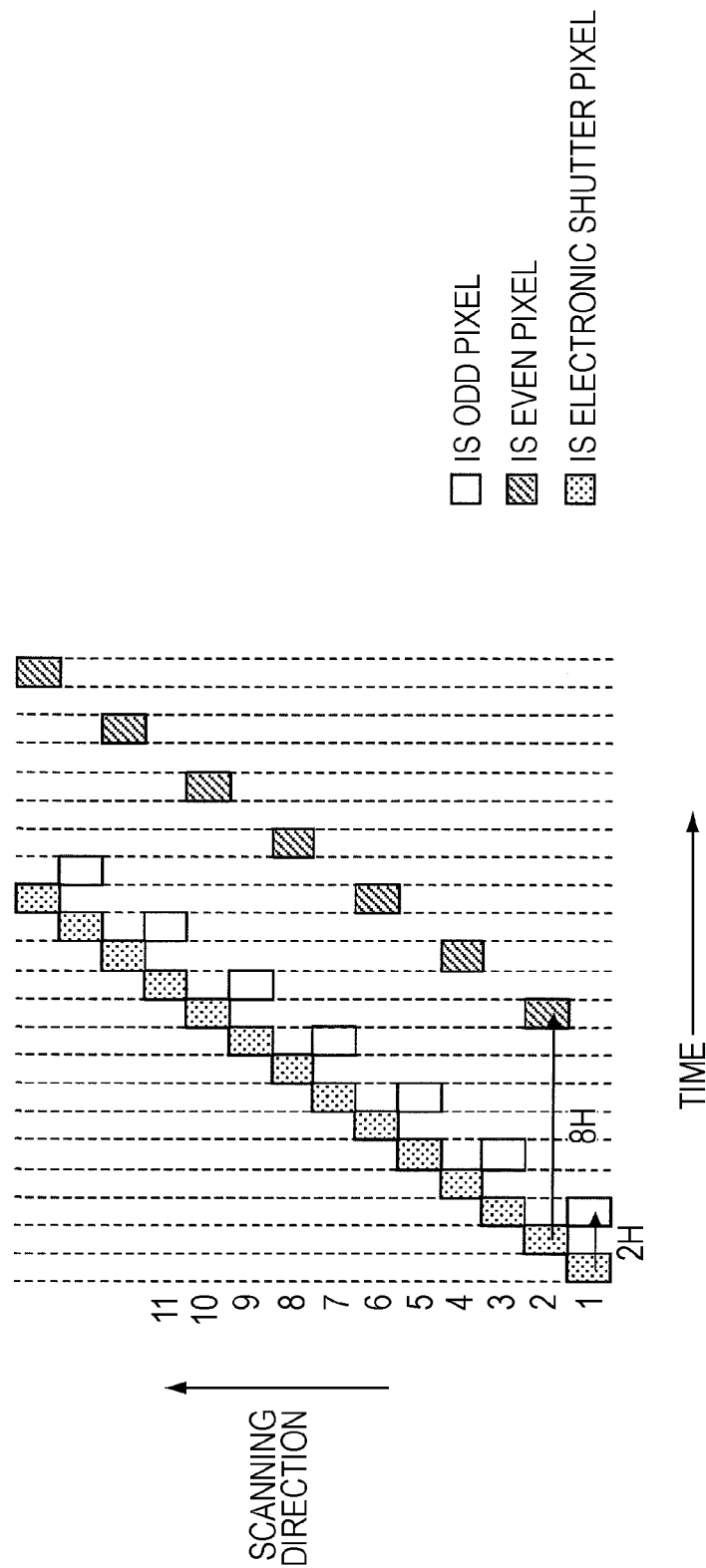
FIG. 5 is a diagram schematically illustrating the electronic shutter scanning and the read scanning according to the embodiment.

Furthermore, the read-scanning system may be constituted by an address decoder so that the odd-row reading pulses are successively output to the odd-pixel rows arranged every other row in a range from a first row to a seventh row as shown in FIG. 5, and from the seventh row onwards, selection scanning is performed alternately on the odd-pixel rows and the even-pixel rows, for example, on the seventh row, the second row, a ninth row, the fourth row, an eleventh row, the sixth row, and so on in this order, by specifying addresses by the address decoder. Here, the address decoder corresponds to the first driving means and the second driving means.

Note that a scanning start row N of zigzag scanning in which the odd-pixel rows and the even-pixel rows are alternately subjected to selection scanning is determined in accordance with an accumulation time aH in which a horizontal period H of the even pixels which have the long accumulation time is employed as a unit. That is, the scanning start row N of the zigzag scanning is obtained by the following equation: N=a−1. In the foregoing example, since the accumulation time aH of the even pixels is 8H, the scanning start row N of the zigzag scanning corresponds to the seventh row. In a case where the accumulation time aH of the even pixels is 10H, the scanning start row N of the zigzag scanning corresponds to the ninth row, and the zigzag scanning is performed from the ninth row onwards.

When the read scanning is performed as described above, image signals are not read from the individual pixels and not output from the CMOS image sensor 10 in an order corresponding to the pixel arrangement of the pixel array unit 12. Accordingly, an image memory such as a frame memory is arranged in the signal processing system in the later stage so that processing of rearranging the pixel signals in an order corresponding to the pixel arrangement is performed by controlling writing of the pixel signals to and reading of the pixel signal from the image memory.

As described above, first, the electronic shutter scanning is performed, and thereafter, the scanning operations, i.e., the odd-pixel reading and the even-pixel reading are performed to thereby determine the accumulation time of the odd-pixel rows and the accumulation time of the even-pixel rows at timings of the odd-pixel reading and the even-pixel reading, respectively.

Specifically, a period from a timing of the electronic shutter scanning to a timing of reading of the odd pixels corresponds to the accumulation time (second accumulation time) of the odd-pixel rows, and a period from a timing of the electronic shutter scanning to a timing of reading of the even pixels corresponds to the accumulation time (first accumulation time) of the even-pixel rows.

(Effects of this Embodiment)

Figure 4:
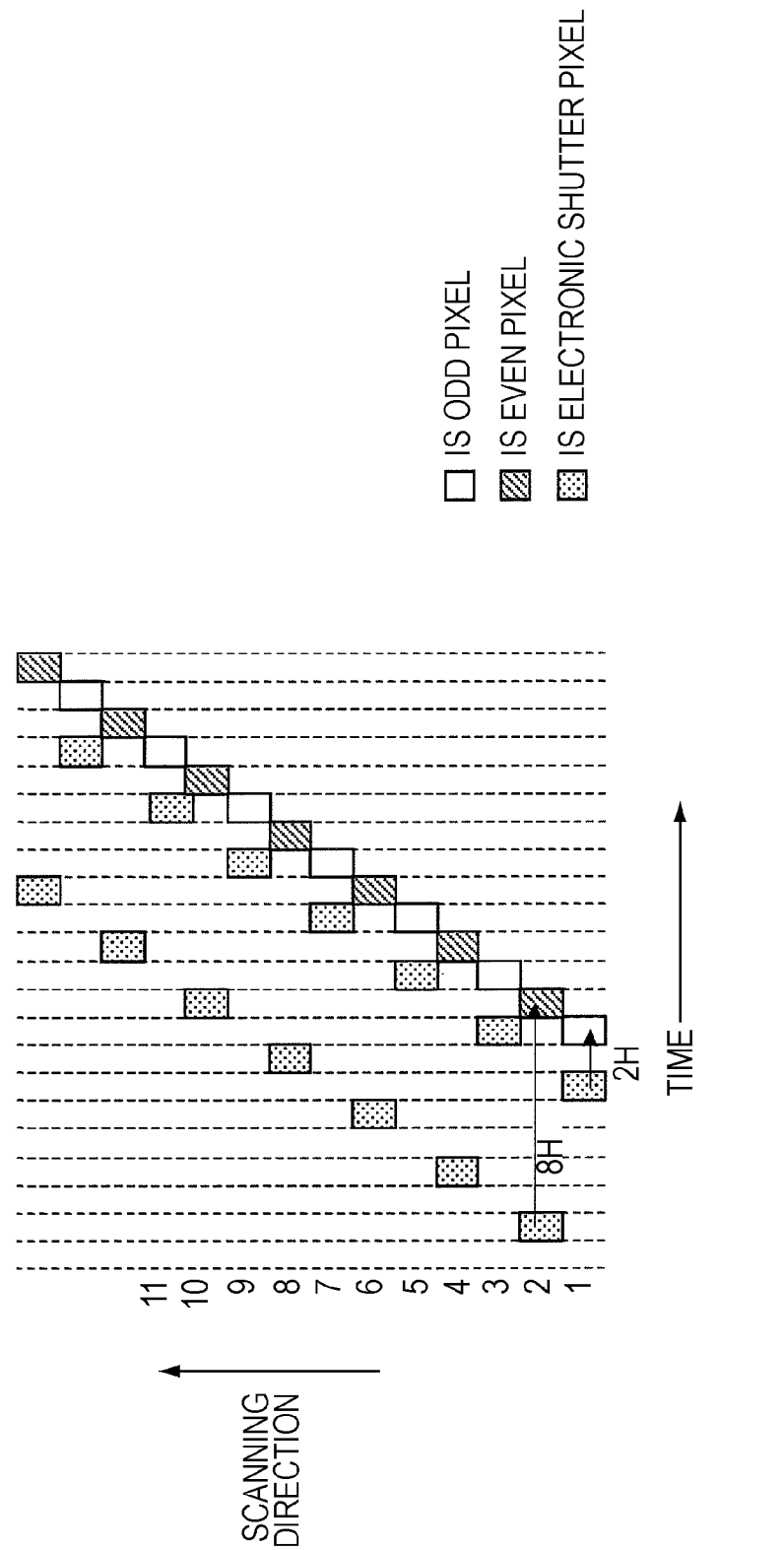
FIG. 4 is a diagram schematically illustrating electronic shutter scanning and read scanning according to the related art.

Next, effects of this embodiment will now be described with reference to FIGS. 4 and 5 while being compared with those of the related art. FIG. 4 is a diagram schematically illustrating the electronic shutter scanning and the read scanning according to the related art. FIG. 5 is a diagram schematically illustrating the electronic shutter scanning and the read scanning according to the embodiment.

In FIGS. 4 and 5, axes of abscissa denote time for the electronic shutter scanning and the read scanning. Although the number of rows, for example, is different from that of FIG. 3 for convenience of explanation, the principle is the same. In this embodiment (FIG. 5), odd-pixel read scanning is performed first, and thereafter, even-pixel read scanning is performed.

Note that, as for the accumulation time, for facilitating understanding, the accumulation time of the odd pixels is determined to be 2H (H denotes the horizontal period) and the accumulation time of the even pixels is determined to be 8H, in the pixel arrangement of 14 rows×22 columns.

<Case of Related Art>

First, a case of the related art will be described with reference to FIG. 4. The read scanning is successively performed on individual pixel rows while the odd-pixel rows and the even-pixel rows are not distinguished from each other, that is, in an order of an odd-pixel row, an even-pixel row, an odd-pixel row, an even-pixel row, and so on. Then, scanning operations are performed in two systems, that is, a scanning operation for the odd-pixel rows and a scanning operation for the even-pixel rows for an electronic shutter, and an accumulation time of the odd-pixel rows and an accumulation time of the even-pixel rows are controlled at timings of the scanning operations in the two systems of the electronic shutter.

As described above, in the driving method in which the accumulation time of the odd-pixel rows and the accumulation time of the even-pixel rows are controlled at timings of operations of the electronic shutter, since a reading operation performed on the odd pixels which has short accumulation time and to which low-sensitive signals are to be supplied is performed in a later stage of the long accumulation time of the even pixels to which high-sensitive signals are to be supplied, in a case where the photodiode 111 is saturated when a period of time corresponding to approximately 4H, for example, has passed after an exposure start time in the even pixels having the long accumulation time which are likely to be saturated, a defect described below occurs.

Specifically, in the saturated even pixels having the long accumulation time, if optical charges overflow from the photodiodes 111 due to incident light which is further incident on, blooming in which part of the optical charges of the overflowing light intrudes the odd pixels in pixel rows (that is, the odd pixels having the short accumulation time) adjacent to a pixel row including the even pixels of interest occurs. When the blooming occurs, amounts of charges of the odd pixels become larger than amounts of the proper charges in accordance with an amount of the incident light by amounts of the optical charges which have been intruded from the even pixels.

Accordingly, in the odd pixels having the short accumulation time, since a reading operation has not yet been performed when the blooming occurs, and therefore, the proportional relationship between a sensitivity and the accumulation time is no longer established after the part of the optical charges overflowing from the even pixels adjacent to the odd pixels of interest intrude, signals in proportion to the accumulation time are not output from the odd pixels.

Note that, here, for facilitating understanding, the description is made taking the case where the blooming in which the part of the optical charges which overflow from the saturated pixels intrude to the individual odd pixels in the pixel rows adjacent to the pixel row including the saturated pixels (saturated even pixels) occurs in the pixel arrangement of 14 rows×22 columns as an example. However, the blooming may occur practically in individual odd pixels in the pixel rows which is arranged far from the pixel rows including the saturated pixels by odd-numbered rows more than three rows in a pixel arrangement including a number of pixels which conform to various graphic display standards, that is, in the pixel arrangement including a number of pixels.

As described above, if the odd pixels which should output the low-sensitive signals do not output signals in proportion to the accumulation time due to the blooming caused by the saturated pixels, the signals output from the odd pixels (low-sensitive signals) are not accurate signals obtained in accordance with amounts of incident light beams. Accordingly, accuracy of the signal processing performed in the signal processing system in the later stage for attaining a wide dynamic range by combining the high-sensitive signals and the los-sensitive signals is degraded.

<Case of this Embodiment>

Next, a case of this embodiment will be described with reference to FIG. 5. Before the read scanning, the electronic shutter scanning is performed successively on individual pixel rows, and thereafter, the read scanning is performed on the odd pixels having the short accumulation time and the read scanning is performed on the even pixels having the long accumulation time whereby, as is apparent from FIG. 5, an exposure period of the odd pixels (a period in which the optical charges are accumulated) corresponds to an exposure start portion (a beginning portion of the exposure start) of the even pixels.

As described above, the exposure period of the odd pixels corresponds to an exposure start portion of the even pixels. Therefore, even if the photodiodes 111 in the even pixels which are likely to be saturated are saturated after a period of approximately 4H, for example, has passed from the exposure start time, the optical charges start overflowing from the photodiodes 111 due to incident light beams which are further incident on, and part of the optical charges intrude into the odd pixels having the short accumulation time adjacent to the even pixels of interest, signals of the odd pixels which have been output are accurate signals, that is, proper signals having signal levels corresponding to amounts of the incident light beams since the reading of the odd pixels having the short accumulation time has been terminated before the optical charges overflow.

Specifically, taking the even pixels of the second row of FIG. 5 as examples, even if the photodiodes 111 are saturated when approximately 4H has passed from the exposure start time of the even pixels of interest and the optical charges start overflowing from the photodiodes 111, after 1H has passed from the exposure start time of the even pixels in a case of the odd pixels in the first row adjacent to the even pixels in the second row, and on the other hand, after 3H has passed from the exposure start time of the even pixels in a case of the odd pixels in the third row adjacent to the even pixels in the second row, that is, before the optical charges overflow from the even pixels in both cases, the reading operation is terminated.

Accordingly, the low-sensitive signals of the odd pixels in the first and third rows adjacent to the even pixels in the second row are not adversely influenced by the optical charges which have overflowed from the even pixels. The same holds true for the odd pixels in the pixel rows arranged far from the pixel row including the saturated pixels by odd-numbered row more than three rows, as well as the odd pixels in the first and third rows.

Note that, part of the optical charges which have overflowed from the even pixels (saturated pixels) in the second row and which have intruded to the odd pixels in the first and third rows are swept away by the next electronic shutter operation, and therefore, are not adversely affect the signals of the odd pixels of interest in the next field.

As described above, when the driving method in which the accumulation time of the odd-pixel rows and the accumulation time of the even-pixel rows are controlled at timings of the odd-pixel reading operation and the even-pixel reading operation is employed, even if the pixels having the long accumulation time and the pixels having the short accumulation time are adjacent to each other, since the reading operation performed on the odd pixels having the short accumulation time has already been terminated before the photodiodes 111 of the even pixels having the long accumulation time are saturated and the optical charges start overflowing, and therefore, the proportional relationship between the sensitivity and the accumulation time of the odd pixels is maintained at the time of reading, low-sensitive signals in proportion to the accumulation time are output from the odd pixels.

Note that in the even pixels which are likely to be saturated, a case where the photodiodes 111 are saturated within approximately 2H from the exposure start time and part of the optical charges start overflowing from the photodiodes 111 corresponds to a case where the photodiodes 111 included in the odd pixels adjacent to the even pixels of interest have already been saturated due to incident light of themselves and amounts of signals are unknown. Therefore, it is not necessary to take such a case into consideration.

As described above, in the CMOS image sensor 10 having the pixel array unit 12 in which the pixels in the first pixel group in which signal charges are accumulated in the first accumulation time and the pixels in the second pixel group in which signal charges are accumulated in the second accumulation time which is shorter than the first accumulation time are separately arranged in the even-pixel rows and the odd-pixel rows, for example, in a unit of pixel row, even when the even pixels are saturated and the signal charges overflow from the even pixels of interest and part of the signal charges intrude into the odd pixels adjacent to the even pixels, by performing reading of the odd pixels having the short accumulation time (second accumulation time) in a beginning portion of the first accumulation time, that is, in a portion of the exposure start time of the even pixels having the long accumulation time (first accumulation time), an adverse effect of the blooming generated when the even pixels are saturated to signals of the odd pixels are eliminated since the reading operation performed on the odd pixels has been terminated.

In the technique of attaining a wide dynamic range described above according to the present invention, since the reading operation is performed only once for individual pixels for capturing an image having a long accumulation time and a short accumulation time, even when read scanning is performed on two pixel rows, speed of the read scanning is not changed. Accordingly, another technique of attaining a wide dynamic range may be used in combination.

Furthermore, in the foregoing embodiment, although the unit pixels 11 included in the pixel array unit 12 are categorized into the two pixel groups of two levels of sensitivity, that is, a low sensitivity and a high sensitivity, the present invention is not limited to this. The unit pixels 11 may be categorized into three or more pixel groups of three or more levels of sensitivity. For example, in a case where the unit pixels 11 are categorized into three pixel groups of three levels of sensitivity, i.e., a low sensitivity, a middle sensitivity, and a high sensitivity, the technique of attaining a wide dynamic range according to the present invention is applied between the pixel group of the low sensitivity and the pixel group of the middle sensitivity and between the pixel group of the middle sensitivity and the pixel group of the high sensitivity.

Note that, in the embodiment described above, the description is made taking the case of the CMOS image sensor in which the unit pixels 11 which detect signal charges corresponding to amounts of visible light beams as physical quantities are arranged in a matrix as an example. However, the present invention is applicable not only the CMOS image sensor but also general image sensors which attain a wide dynamic range in which accumulation times of adjacent pixels are differentiated.

Furthermore, the present invention is applicable to not only image sensors in which a distribution of quantities of incident visible light beams is detected so as to be captured as an image, but also image sensors in which a distribution of quantities of infrared rays, X-rays, or particles, for example, is captured as an image, general solid-state imaging devices (physical-quantity distribution detection devices), such as a fingerprint detection sensor, in which a distribution of other physical quantities, such as pressures or capacitances in the broad sense is detected so as to be captured as an image.

Moreover, the present invention is also applicable to not only solid-state imaging devices in which pixels in a pixel array unit are successively scanned on a row-by-row basis so that signals are read from the pixels but also solid-state imaging devices of X-Y address type in which arbitrary pixels are selected on a pixel-by-pixel basis and signals are read from the selected pixels on a pixel-by-pixel basis.

When a wide dynamic range method is employed in general solid-state imaging devices including the solid-state imaging devices of X-Y address type, in a pixel array unit in which pixels which detect physical quantities are two-dimensionally arranged in a matrix, among the pixels included in the pixel array unit, physical quantities of pixels of a first pixel group which are accumulated in a first accumulation time are read, and in addition, physical quantities of pixels, which are arranged adjacent to the pixels of the first pixel group, of a second pixel group which are accumulated in a second accumulation time which is shorter than the first accumulation time are read in a beginning portion of the first accumulation time. Accordingly, since a reading operation performed on the pixels of the second pixel group has already been terminated when the pixels of the first pixel group are saturated, an adverse effect of blooming caused by the saturation of the pixels of the first pixel group to signals (low-sensitive signals) of the pixels of the second pixel group may be eliminated.

Not that such a solid-state imaging device may be formed as one chip or as a module form which has an imaging function and in which an imaging unit and one of a signal processing unit and an optical system are integrally packaged.

Furthermore, the present invention is applicable to not only the solid-state imaging devices but also imaging devices. Here, the imaging devices include camera systems, such as digital still cameras and video cameras, and electronic devices having imaging functions, such as cellular phones. Note that the module form which is mounted on the electronic devices, that is, a camera module may be included in the imaging devices.

[Imaging Device]

Figure 6:
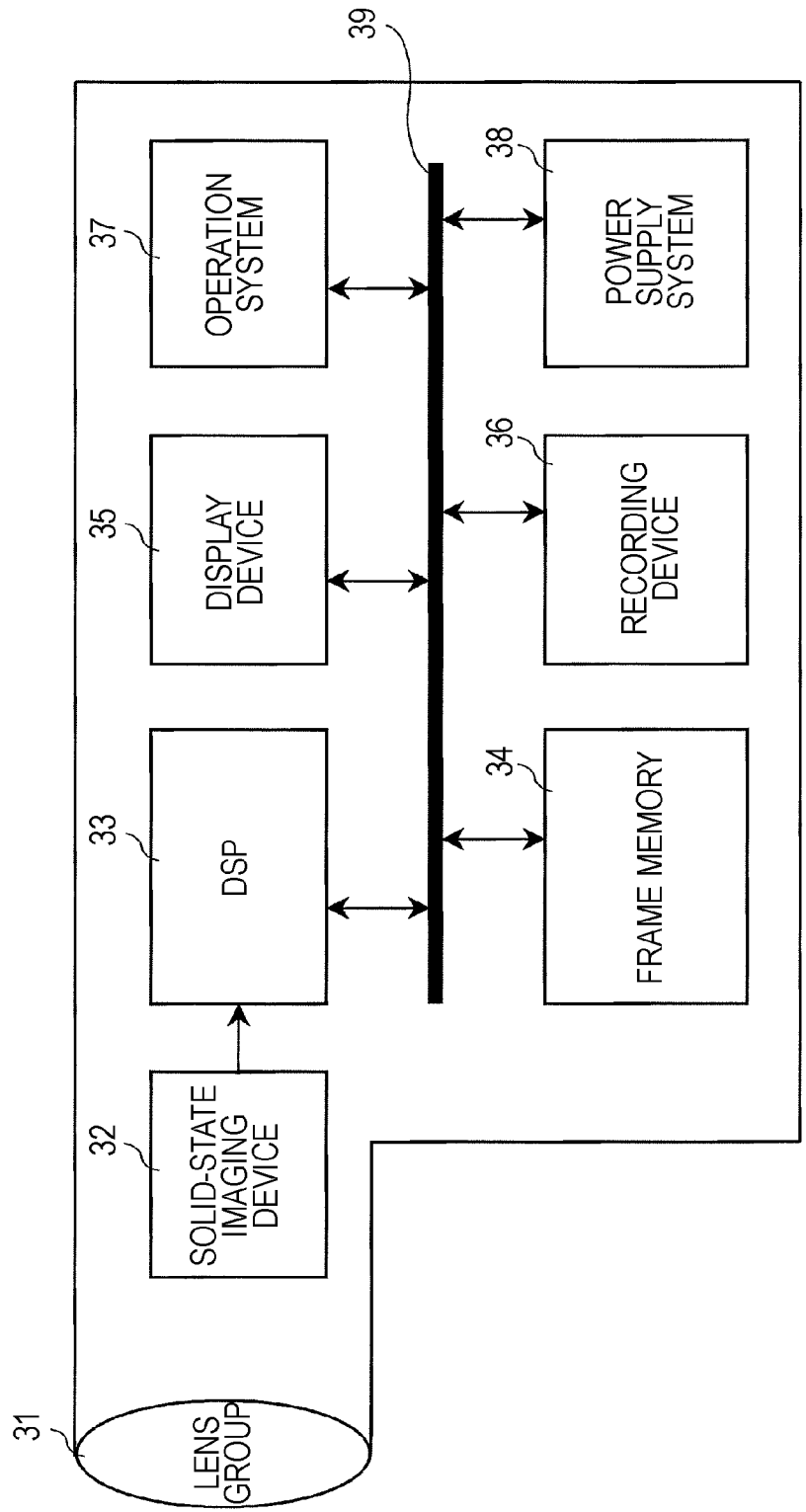
FIG. 6 is a block diagram illustrating an example of a configuration of an imaging device according to the present invention.

FIG. 6 is a block diagram illustrating an example of a configuration of an imaging device according to the present invention. As shown in FIG. 6, the imaging device according to the present invention includes an optical system including a lens group 31, a solid-state imaging device 32, a DSP (Digital Signal Processor) circuit 33 serving as a camera signal processing circuit, a frame memory 34, a display device 35, a recording device 36, an operation system 37, and a power supply system 38. The DSP circuit 33, the frame memory 34, the display device 35, the recording device 36, the operation system 37, and the power supply system 38 are connected to one another through a bus line 39.

The lens group 31 receives incident light beams (image light beams) from an object and forms an image on an imaging plane of the solid-state imaging device 32. The solid-state imaging device 32 converts light quantities of the incident light beams which are used to form the image on the imaging plane by the lens group 31 into electric signals for individual pixels and outputs the electric signals as pixel signals. The CMOS image sensor 10 according to the embodiment described above is used as the solid-state imaging device 32.

An order of the pixel signals output from the CMOS image sensor 10 serving as the solid-state imaging device 32 does not corresponds to an order of the pixel arrangement of the pixel array unit 12 shown in FIG. 1, as described above, but corresponds to an order of the read scanning in the technique of attaining a wide dynamic range according to the present invention.

The DSP circuit 33 performs various signal processing operations on the pixel signals output from the solid-state imaging device 32. As an example of the operations, the pixel signals output from the solid-state imaging device 32 in an order in accordance with the read scanning in the technique of attaining a wide dynamic range according to the present invention are controlled to be written into the frame memory 34 in an order corresponding to the pixel arrangement of the pixel array unit 12, and the frame memory 34 reads the pixel signals in the order corresponding to the pixel arrangement of the pixel array unit 12.

The DSP circuit 33 further performs signal processing in which pixel signals of even pixels having a long accumulation time and pixel signals of odd pixels having a short accumulation time are combined so as to obtain an image which has an excellent image gradation (levels of brightness), that is, an image having a wide dynamic range, taking a rate of the accumulation times into consideration. In addition to such signal processing, the DSP circuit 33 performs various known camera signal processing operations.

The display device 35 which is a panel display device such as a liquid crystal display device or an organic EL (Electro Luminescence) display device displays moving images or still images captured by the solid-state imaging device 32. The recording device 36 records the moving images or the still images captured by the solid-state imaging device 32 in a recording medium such as a video tape or a DVD (Digital Versatile Disk).

The operation system 37 issues operation instructions on various functions included in the imaging device during an operation conducted by a user. The power supply system 38 properly supplies various power sources serving as operation power sources of the DSP circuit 33, the frame memory 34, the display device 35, the recording device 36, and the operation system 37 to these objects of supply.

As described above, when the CMOS image sensor 10 according to the foregoing embodiment is used as the solid-state imaging device 32 in an imaging device such as a video camera, digital still camera, and a camera module for a mobile device such as a cellular phone, since an adverse effect of blooming caused by saturation of pixels having a long accumulation time to which high-sensitive signals are to be supplied to pixel signals having a short accumulation time (low-sensitive signals) is eliminated in the CMOS image sensor 10, high-accuracy signal processing is performed in the DSP circuit 33 for attaining a wide dynamic range, and accordingly, quality of an captured image is improved.

According to the present invention, when a method for attaining a wide dynamic range by differentiating accumulation times of adjacent pixels is employed, since a reading operation performed on pixels in a second pixel group which have a short accumulation time is performed in an exposure start portion of pixels of a first pixel group which have a long accumulation time, even when the pixels of the first pixel group are saturated and physical quantities intrude into the pixels of the second pixel group, an adverse effect of blooming caused by the saturation of the pixels of the first pixel group to signals (low-sensitive signals) of the pixels of the second pixel group may be eliminated since the reading operation performed on the pixels of the second pixel group has already been terminated by this time.

The invention claimed is:

1. An imaging device comprising:
   a pixel array section configured to have a plurality of pixels; and
   a pixel driving section configured to cause a first signal of a first pixel group to have a first optical charge accumulation time, and to cause a second signal of a second pixel group to have a second optical charge accumulation time,
   wherein the second optical charge accumulation time is shorter than the first optical charge accumulation time, and wherein an optical charge reset, an accumulation of optical charge, and a subsequent reading of the accumulated optical charge for a pixel of the second pixel group adjacent to a pixel of the first pixel group occurs during the first optical charge accumulation time.

2. The imaging device of claim 1, wherein pixels of the second pixel group are arranged in different rows of the pixel array section.

3. The imaging device of claim 1, wherein the pixel driving section causes a reading timing of the second pixel group to be different from a reading timing of the first pixel group.

4. The imaging device of claim 1, wherein the imaging device is a CMOS sensor.

5. The imaging device of claim 1, wherein the pixel driving section causes the second signal of the second pixel group to be read before the first signal of the first pixel group to be read.

6. The imaging device of claim 1, wherein the first signal of the first pixel group and the second signal of the second pixel group are read in a same frame.

7. The imaging device of claim 1, wherein at least one of the pixels has a photoelectric conversion element and a transfer transistor.

8. The imaging device of claim 1, wherein one of the pixels has a reset transistor element.

9. The imaging device of claim 1, wherein one of the pixels has an amplifying transistor element.

10. The imaging device of claim 1, wherein the pixels of the first pixel group and the pixels of the second pixel group are arranged in first-numbered rows and second-numbered rows in the pixel array section, respectively.

11. The imaging device of claim 1, wherein the pixel driving section generates at least one of a reset control pulse and a read control pulse.

12. The imaging device according to claim 1, wherein the optical charge reset, the accumulation of optical charge, and the subsequent reading of the accumulated optical charge for the pixel of the second pixel group adjacent to the pixel of the first pixel group terminates during the first accumulation time of optical charge for the first pixel.

13. An electronic apparatus comprising:
   an imaging device including:
      a pixel array section configured to have a plurality of pixels; and a pixel driving section configured to cause a first signal of a first pixel group to have a first optical charge accumulation time, and to cause a second signal of a second pixel group to have a second optical charge accumulation time, wherein the second optical charge accumulation time is shorter than the first optical charge accumulation time, and wherein an optical charge reset, an accumulation of optical charge, and a subsequent reading of the accumulated optical charge for a pixel of the second pixel group adjacent to a pixel of the first pixel group occurs during the first optical charge accumulation time; and at least one lens configured to form an image on the pixel array section.

14. The electronic apparatus according to claim 13, wherein pixels of the first pixel group and pixels of the second pixel group are arranged in different rows of the pixel array section.

15. The electronic apparatus according to claim 13, wherein the pixel driving section causes a reading timing of the second pixel group to be different from a reading timing of the first pixel group.

16. The electronic apparatus according to claim 13, wherein the imaging device is a CMOS sensor.

17. The electronic apparatus according to claim 13, wherein the pixel driving section causes the second signal of the second pixel group to be read before the first signal of the first pixel group to be read.

18. The electronic apparatus according to claim 13, wherein the first signal of the first pixel group and the second signal of the second pixel group are read in a same frame.

19. The electronic apparatus according to claim 13, wherein one of the pixels includes a photoelectric conversion element, a transfer transistor element, a reset transistor element, and an amplifying transistor element and the pixel driving section generates at least one of a reset control pulse and a read control pulse.

20. The electronic apparatus according to claim 13, wherein the pixels of the first pixel group and the pixels of the second pixel group are arranged in first-numbered rows and second-numbered rows in the pixel array section, respectively.

* * * * *